(12) United States Patent
Ding et al.

(10) Patent No.: US 10,884,538 B2
(45) Date of Patent: Jan. 5, 2021

(54) OLED TOUCH DISPLAY PANEL, DISPLAY DEVICE AND METHOD FOR DETECTING TOUCH OPERATION ZONE

(71) Applicant: BOE Technology Group Co., Ltd., Beijing (CN)

(72) Inventors: Xiaoliang Ding, Beijing (CN); Haisheng Wang, Beijing (CN); Yingming Liu, Beijing (CN); Xueyou Cao, Beijing (CN); Wei Liu, Beijing (CN); Ping Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 165 days.

(21) Appl. No.: 15/769,860

(22) PCT Filed: Sep. 29, 2017

(86) PCT No.: PCT/CN2017/104169
§ 371 (c)(1),
(2) Date: Apr. 20, 2018

(87) PCT Pub. No.: WO2018/137356
PCT Pub. Date: Aug. 2, 2018

(65) Prior Publication Data
US 2019/0258350 A1    Aug. 22, 2019

(30) Foreign Application Priority Data
Jan. 25, 2017 (CN) .......................... 2017 1 0061293

(51) Int. Cl.
*G06F 3/041* (2006.01)
*G09G 3/3208* (2016.01)
(Continued)

(52) U.S. Cl.
CPC ............ *G06F 3/0416* (2013.01); *G06F 3/045* (2013.01); *G06F 3/0412* (2013.01);
(Continued)

(58) Field of Classification Search
USPC ......................................................... 345/173
See application file for complete search history.

(56) References Cited

U.S. PATENT DOCUMENTS 8,471,462 B2    6/2013    Moon
8,890,833 B2    11/2014   You
(Continued)

FOREIGN PATENT DOCUMENTS

CN           103984442 A       8/2014
CN           105094441    *    11/2015
(Continued)

OTHER PUBLICATIONS

International Search Report and Written Opinion, including English translations of both, for International Application No. PCT/CN2017/104169, dated Nov. 28, 2017, 18 pages.

*Primary Examiner* — Amr A Awad
*Assistant Examiner* — Jonathan G Cooper
(74) *Attorney, Agent, or Firm* — Westman, Champlin & Koehler, P.A.

(57) ABSTRACT

Examples of the disclosure provide an OLED touch display panel, a display device and a method for detecting a touch operation zone, relate to the field of touch display, and may achieve an incell touch display panel. The display panel has an OLED component, which comprises a first electrode; a piezoresistive material layer, which is above the first electrode of the OLED component; a touch electrode layer, which is above the piezoresistive material layer; and a first stripe electrode, a second stripe electrode, a third stripe electrode and a fourth stripe electrode, which are provided above the touch electrode layer and not contacted with each other.

3 Claims, 2 Drawing Sheets

(51) Int. Cl.
*H01L 27/32* (2006.01)
*G06F 3/045* (2006.01)

(52) U.S. Cl.
CPC ....... *G06F 3/04166* (2019.05); *G09G 3/3208* (2013.01); *H01L 27/323* (2013.01)

(56) References Cited

U.S. PATENT DOCUMENTS

| | | | | |
|---|---|---|---|---|
| 2009/0096764 A1* | 4/2009 | You | ................ | G06F 3/0412 |
| | | | | 345/174 |
| 2010/0264938 A1* | 10/2010 | Yeh | ................ | G06F 3/045 |
| | | | | 324/649 |
| 2012/0062511 A1* | 3/2012 | Ishizaki | ................ | G06F 3/0412 |
| | | | | 345/174 |
| 2014/0368756 A1* | 12/2014 | Lee | ................ | G06F 3/0412 |
| | | | | 349/12 |

FOREIGN PATENT DOCUMENTS

| | | |
|---|---|---|
| CN | 105094441 A | 11/2015 |
| CN | 205121513 U | 3/2016 |
| CN | 106843589 A | 6/2017 |

\* cited by examiner

OLED TOUCH DISPLAY PANEL, DISPLAY DEVICE AND METHOD FOR DETECTING TOUCH OPERATION ZONE

CROSS-REFERENCE TO RELATED APPLICATION

This application is a Section 371 National Stage Application of International Application No. PCT/CN2017/104169, filed on 29 Sep. 2017, which has not yet published and claims priority to Chinese Patent Application No. 201710061293.8, entitled as "OLED TOUCH DISPLAY PANEL, DISPLAY DEVICE AND METHOD FOR DRIVING THE SAME" and filed on Jan. 25, 2017, the contents of which are incorporated herein by reference in their entirety.

TECHNICAL FIELD

The disclosure relates to the field of touch display, in particular, to an OLED touch display panel, a display device and a method for detecting a touch operation zone.

BACKGROUND ART

Touch display panels may be classified into oncell type, in which the touch electrode is provided on the display side of the display panel cell, and incell type, in which the touch electrode is provided in the display panel cell, according to the various positions of the touch electrode with respect to the display panel.

A touch electrode generally has a certain pattern, which is formed by a patterning process. However, for a touch display panel with an organic light-emitting display (OLED) configuration, since the light-emitting functional layer in the OLED device tends to be influenced easily by environmental factors in the patterning process, such as the high temperature, the developing solution, and the like, it is difficult to achieve incell touch control for an OLED touch display panel.

SUMMARY

Examples of the disclosure provide an OLED touch display panel, a display device and a method for detecting a touch operation zone, and may achieve incell touch control for a display panel.

Examples of the disclosure apply the following technical solutions for the above-mentioned purpose.

In an aspect, an example of this disclosure provides an OLED touch display panel, comprising:

an OLED component, which comprises a first electrode;

a piezoresistive material layer, which is above the first electrode of the OLED component;

a touch electrode layer, which is above the piezoresistive material layer; and a first stripe electrode, a second stripe electrode, a third stripe electrode and a fourth stripe electrode, which are above the touch electrode layer and not contacted with each other, wherein the first stripe electrode and the second stripe electrode are provided oppositely and parallelly, and configured to form a first electric potential field on the touch electrode layer between the first stripe electrode and the second stripe electrode along a first direction perpendicular to a length direction of the first stripe electrode; the third stripe electrode and the fourth stripe electrode are provided oppositely and parallelly, and configured to form a second electric potential field on the touch electrode layer between the third stripe electrode and the fourth stripe electrode along a second direction perpendicular to a length direction of the third stripe electrode; the length direction of the first stripe electrode is perpendicular to the length direction of the third stripe electrode; the first stripe electrode, the second stripe electrode, the third stripe electrode and the fourth stripe electrode define a touch operation zone.

Optionally, the piezoresistive material layer comprises a piezoresistive material, whose resistance decreases when pressure is applied thereon.

Optionally, when the piezoresistive material, whose resistance decreases when pressure is applied thereon, is not subjected to any pressure, the piezoresistive material is insulating; and when the piezoresistive material, whose resistance decreases when pressure is applied thereon, is subjected to a pressure exceeding a threshold value, the piezoresistive material becomes conductive at the position where the pressure is applied.

Optionally, both of the first stripe electrode and the second stripe electrode have a length equal to a first length, and the portion where the first stripe electrode opposite to the second stripe electrode has a length equal to the first length.

Optionally, both of the third stripe electrode and the fourth stripe electrode have a length equal to a second length, and the portion where the third stripe electrode opposite to the fourth stripe electrode has a length equal to the second length.

Optionally, the OLED touch display panel comprises a display zone and a frame zone around the display zone; the first stripe electrode, the second stripe electrode, the third stripe electrode and the fourth stripe electrode are provided in the frame zone.

Optionally, the OLED component comprises the first electrode, an organic light-emitting functional layer and a second electrode.

Optionally, the first electrode is a cathode of the OLED component, and the second electrode is an anode of the OLED component.

Optionally, the OLED touch display panel comprises a substrate under the OLED component.

Optionally, the OLED touch display panel further comprises a separator layer above the touch electrode layer, wherein the separator layer comprises a plurality of separators distributed at least in the touch operation zone and filling material that covers the separators and fills gaps between the separators.

Optionally, the OLED touch display panel further comprises a polarizer sheet, an adhesive layer and a protective layer, which are provided above the touch electrode layer sequentially.

In another aspect, an example of this disclosure provides a display device, comprising the OLED touch display panel according to any of above and a detection circuit, wherein the detection circuit is configured to detect information of a touch point position on the OLED touch display panel, and the detection circuit comprises:

a voltage source, which is connected to the first to the fourth stripe electrodes, respectively, to form the first electric potential field and the second electric potential field alternately;

a process circuit, which is configured to obtain alternatively coordinates of the touch point in the first electric potential field and the second electric potential field according to a press current at the touch point during the period that the OLED touch display panel displays one frame of image, wherein the press current is a current which flows through the piezoresistive material layer when the piezoresistive material between the touch electrode layer and the first electrode of the OLED component at the touch point is subjected to pressure.

Optionally, the piezoresistive material layer comprises a piezoresistive material, whose resistance decreases when pressure is applied thereon, and when the piezoresistive material, whose resistance decreases when pressure is applied thereon, is not subjected to any pressure, the piezoresistive material is insulating; and when the piezoresistive material, whose resistance decreases when pressure is applied thereon, is subjected to a pressure exceeding a threshold value, the piezoresistive material becomes conductive at the position where the pressure is applied, and the press current is a current which flows through the piezoresistive material layer when the piezoresistive material between the touch electrode layer and the first electrode of the OLED component at the touch point becomes conductive by being subjected to pressure.

Optionally, the process circuit comprises an integrator, a comparator, a counter and a processor, wherein the integrator comprises an operational amplifier, wherein the operational amplifier has a negative input terminal connected electrically to the first electrode of the OLED component, and the operational amplifier has a grounded positive input terminal, and the operational amplifier has an output terminal connected electrically to a negative input terminal of the comparator, to output a voltage output value to the comparator;

a storage capacitance, wherein the storage capacitance is connected electrically between the negative input terminal of the operational amplifier and the output terminal of the operational amplifier;

a switching circuit connected to the storage capacitance in parallel, wherein the switching circuit is controlled by an output terminal of the comparator, so as to switch off when the voltage output value reaches a voltage reference value and switch on when the voltage output value is smaller than the voltage reference value;

the negative input terminal of the comparator receives the voltage output value output by the operational amplifier; a positive input terminal of the comparator receives the voltage reference value; the comparator has an output terminal connected electrically to the counter, and the output terminal is also configured to control the switching circuit;

the counter is configured to counting the number of impulse signals output by the output terminal of the comparator; and the processor is configured to obtain alternatively coordinates of the touch point in the first electric potential field or in the second electric potential field according to the time intervals of the counting of the counter.

In still another aspect, an example of this disclosure provides a method for detecting a touch operation zone on the above-mentioned OLED touch display panel, comprising:

forming the first electric potential field and the second electric potential field on the touch electrode layer alternatively;

obtaining alternatively coordinates of the touch point in the first electric potential field and the second electric potential field according to a press current at the touch point during the period that the OLED touch display panel displays one frame of image, wherein the press current is a current which flows through the piezoresistive material layer when the piezoresistive material between the touch electrode layer and the first electrode of the OLED component at the touch point is subjected to pressure.

Optionally, the piezoresistive material layer comprises a piezoresistive material, whose resistance decreases when pressure is applied thereon, and when the piezoresistive material, whose resistance decreases when pressure is applied thereon, is not subjected to any pressure, the piezoresistive material is insulating; and when the piezoresistive material, whose resistance decreases when pressure is applied thereon, is subjected to a pressure exceeding a threshold value, the piezoresistive material becomes conductive at the position where the pressure is applied, and the press current is a current which flows through the piezoresistive material layer when the piezoresistive material between the touch electrode layer and the first electrode of the OLED component at the touch point becomes conductive by being subjected to pressure.

Optionally, the above-mentioned display device is used, and the obtaining alternatively coordinates of the touch point in the first electric potential field and the second electric potential field according to a press current at the touch point during the period that the OLED touch display panel displays one frame of image comprises:

obtaining a first time interval of the counting of the counter, according to a first electrode current of the OLED component when there is no touch, during the period that the OLED touch display panel displays one frame of image;

obtaining a second time interval of the counting of the counter, according to a test current, during the period that the OLED touch display panel displays one frame of image, wherein the test current is the sum of the first electrode current and the press current; and obtaining alternatively coordinates of the touch point in the first electric potential field and the second electric potential field according to the difference between the reciprocal of the second time interval and the reciprocal of the first time interval.

DESCRIPTION OF DRAWINGS

In order to describe the technical solutions in examples of this disclosure more clearly, drawings needed to be used in illustration for examples will be described briefly below. Obviously, the drawings in the description below are only exemplary examples of this disclosure. For a person skilled in the art, other drawings may be obtained according to these drawings without inventive labor.

DETAILED EMBODIMENT

Figure 1:
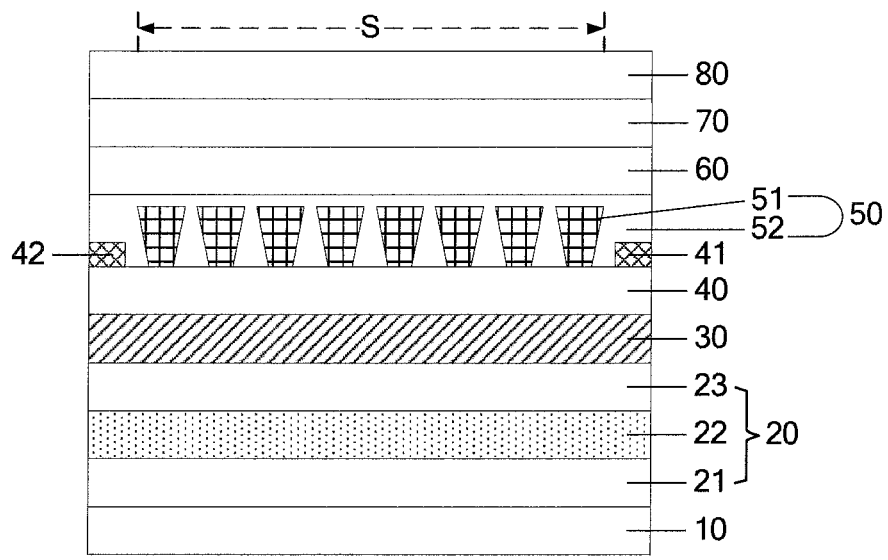
FIG. 1 is a schematic structural sectional view of an OLED touch display panel provided by an example of this disclosure.

The technical solutions in examples of this disclosure will be clearly and fully described by incorporating drawings of this disclosure. Obviously, the examples described only a part of examples of this disclosure, but not all examples. On the basis of the examples in this disclosure, all other examples obtained by a person skilled in the art without inventive labor belong to the protection scope of this disclosure.

It should be noticed that unless defined otherwise, all terms (including scientific and technical terms) used in examples of this disclosure should have the same meanings as those being understood commonly by those of ordinary skill in the art to which this disclosure belongs. It should also be noticed that the terms defined in general dictionaries should be understood as having the same meanings as the meanings thereof in the context of the related art, but should not be interpreted by idealized or extremely formalized meanings, unless defined clearly herein.

For example, the word, such as "first", "second", or the like, used in this disclosure does not represent any order, number, or importance, but is used to distinguish different components. The word, such as "include", "comprise", "have", or the like, used in this disclosure means that the element or article occurring before this word encompasses the element or article and the equivalent thereof enumerated after this word and does not exclude other elements or articles. The word indicating direction or position relationship, such as "above", "below", or the like, relates to the direction or position relationship on the basis of the drawings. They are simplified description for explaining the technical solution of the disclosure easily, but do not mean or imply that the referred device or element must be in a certain direction or be constructed or operated in a certain direction. Therefore, they are not understood as limitation to this disclosure.

Further, since the structures in the OLED touch display panel referred in examples of this disclosure practically have very tiny sizes, the sizes of the structures and the thickness of the film layer in the drawings of examples of this disclosure are enlarged for clarity, and do not represent the proportion of real sizes.

An OLED touch display panel of this disclosure comprises:

an OLED component, which comprises a first electrode;

a piezoresistive material layer, which is above the first electrode of the OLED component;

a touch electrode layer, which is above the piezoresistive material layer; and a first stripe electrode, a second stripe electrode, a third stripe electrode and a fourth stripe electrode, which are provided above the touch electrode layer and not contacted with each other, wherein the first stripe electrode and the second stripe electrode are provided oppositely and parallelly, and configured to form a first electric potential field on the touch electrode layer between the first stripe electrode and the second stripe electrode along a first direction perpendicular to a length direction of the first stripe electrode; the third stripe electrode and the fourth stripe electrode are provided oppositely and parallelly, and configured to form a second electric potential field on the touch electrode layer between the third stripe electrode and the fourth stripe electrode along a second direction perpendicular to a length direction of the third stripe electrode; the length direction of the first stripe electrode is perpendicular to the length direction of the third stripe electrode; the first stripe electrode, the second stripe electrode, the third stripe electrode and the fourth stripe electrode define a touch operation zone.

In an illustrative example of this disclosure as shown in FIG. 1, an OLED touch display panel 01 is provided. This display panel comprises an OLED component 20 provided on a substrate 10. The OLED component 20 comprises an anode 21, a light-emitting functional layer 22 and a cathode 23 (as the first electrode), which are away from the substrate 10 sequentially. It further comprises a piezoresistive material layer 30 on the cathode 23, a touch electrode layer 40 on the piezoresistive material layer 30, and a first stripe electrode 41, a second stripe electrode 42, a third stripe electrode 43 and a fourth stripe electrode 44 on the touch electrode layer 40 and not coming into contact with each other (the stripe electrodes 43 and 44 are not shown in FIG. 1, while being shown in FIG. 2), wherein the first stripe electrode 41 and the second stripe electrode 42 are provided oppositely and parallelly; the third stripe electrode 43 and the fourth stripe electrode 44 are provided oppositely and parallelly; the length direction of the first stripe electrode 41 is perpendicular to the length direction of the third stripe electrode 43; the first stripe electrode 41, the second stripe electrode 42, the third stripe electrode 43 and the fourth stripe electrode 44 surround a touch operation zone (indicated as S in the figure); the first stripe electrode 41, the second stripe electrode 42, the third stripe electrode 43 and the fourth stripe electrode 44 are connected electrically to a detection circuit, respectively, for forming a first electric potential field on the surface of the touch electrode layer 40 corresponding to the part between the first stripe electrode 41 and the second stripe electrode 42 along a first direction, and forming a second electric potential field on the surface of the touch electrode layer 40 corresponding to the part between the third stripe electrode 43 and the fourth stripe electrode 44 along a first direction; the above-mentioned first direction is a direction perpendicular to the length direction of the first stripe electrode 41, and the above-mentioned second direction is a direction perpendicular to the length direction of the third stripe electrode 43.

The following should be noticed. First, the above-mentioned substrate 10 may be, for example, an array substrate, on which a plurality of TFT (thin film transistor) structures are formed and arranged in an array. Further, the substrate 10 also may be a monocrystalline silicon chip having an integrated drive circuit. The structure of the monocrystalline silicon chip may be formed by the existing and well-developed integrated circuit CMOS (complementary metal-oxide semiconductor) process. It can achieve the active addressing matrix of the pixel units in the display device, and also can integrate driver control circuit with various functions, such as T-CON (i.e. a logic board or a center control board), on the monocrystalline silicon chip.

Second, since the touch electrode layer 40 is a full-layer electrode formed on the surface of the piezoresistive material layer 30 by a process such as coating, it has no pattern, and thus needs not to be subjected to a patterning treatment. Therefore, it will not influence the property of the underlying OLED component 20, and it is easy to be made technically.

Third, the 4 stripe electrodes mentioned above indicate electrodes having a substantially elongated shape, which may be specifically an elongated rectangle, an elongated ellipse, an elongated hackle, or the like.

Fourth, the second electrode 21 in the drawings also may be a cathode. Correspondingly, the first electrode 23 in the figures also may be an anode. It should be understood that the structure under the piezoresistive material layer 30 in FIG. 1 is merely illustrative, and may be other OLED component structures, as long as the piezoresistive material layer 40 is above the top electrode thereof. For convenience, examples, in which the first electrode is the cathode and the second electrode is the anode, are used for explanation below. However, the technical solutions, in which the first electrode is an anode and the second electrode is the cathode are also in the scope of this disclosure.

Figure 2:
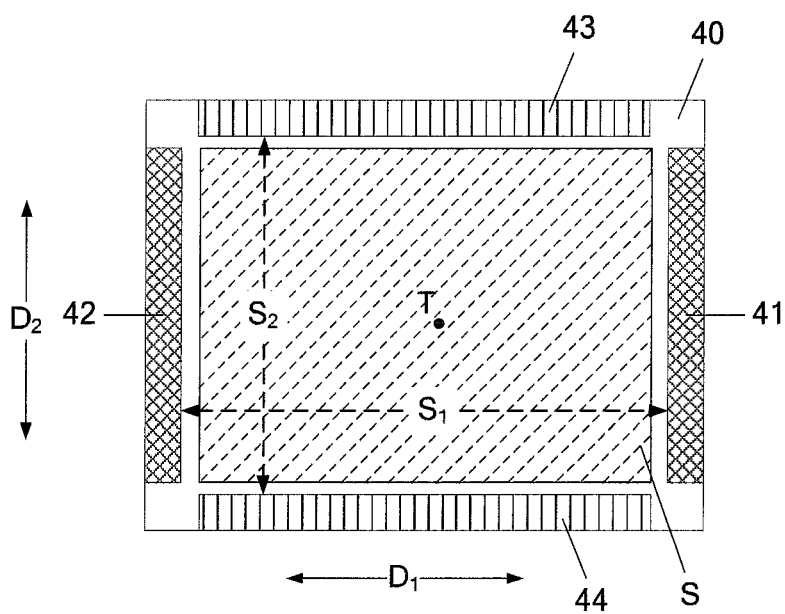
FIG. 2 shows the arrangement manner of the first stripe electrode, the second stripe electrode, the third stripe electrode and the fourth stripe electrode on the surface of the touch electrode layer.

In particular, the first stripe electrode 41 and the second stripe electrode 42 are provided oppositely and parallelly, third stripe electrode 43 and the fourth stripe electrode 44 are provided oppositely and parallelly, and the first stripe electrode 41, the second stripe electrode 42, the third stripe electrode 43 and the fourth stripe electrode 44 define a touch operation zone. It means that the first stripe electrode 41 and the second stripe electrode 42 are provided parallelly and apart and these two electrodes have parts opposite to each other along the length direction, and similarly, the third stripe electrode 43 and the fourth stripe electrode 44 are provided parallelly and apart and these two electrodes have parts opposite to each other along the length direction. As shown in FIG. 2, the zone formed by the opposite parts of the first stripe electrode 41 and the second stripe electrode 42 (indicated as $S_1$ in the figure) overlaps the zone formed by the opposite parts of the third stripe electrode 43 and the fourth stripe electrode 44 (indicated as $S_2$ in the figure), the portion where they overlap is the touch operation zone S.

Here, the specific zone location of the touch operation zone S in the above-mentioned OLED touch display panel 01 depends on the location of the above-mentioned electrodes, which are oppositely pairwise provided in the display panel, and on the stripe length of the electrodes.

The touch operation zone may be larger than or equal to the area of the display zone. For example, as shown in FIG. 2, when the 4 stripe electrodes mentioned above are provided in the frame zone around the OLED touch display panel 01 respectively and the stripe length of each electrode is larger than or equal to the nearby side length of the display zone, the touch operation zone S mentioned above is larger than or equal to the area of the display zone of the OLED touch display panel 01. That is to say, the whole display zone of the OLED touch display panel 01 is a touch zone, so that the location of any touch point within the display zone is detectable.

The structure, in which the touch operation zone is the whole display zone of the OLED touch display panel 01, is preferably suitable for small size single-point touch devices, such as an automatic teller machine (ATM), a cash recycling system (CRS), a ticket seller, a, etc.

When the 4 stripe electrodes mentioned above are provided in the frame zone around the OLED touch display panel 01 respectively and the stripe length of each electrode is smaller than the nearby side length of the display zone, or when the 4 stripe electrodes mentioned above are provided in the display zone, the touch operation zone S mentioned above is smaller than the area of the whole display zone of the OLED touch display panel 01. That is to say, a part of region in the display zone of the above-mentioned OLED touch display panel 01 is used as the touch operation zone.

The structure, in which the touch operation zone is a part of region of the whole display zone of the OLED touch display panel 01, is preferably suitable for large size single-point touch devices, such as a large size display screen. It is merely required to set a part of region of the display zone as the area for touch control, while the other region may be used for other display.

Further, the first stripe electrode 41 and the second stripe electrode 42 are provided oppositely and parallelly, and when a detection circuit applies different voltages to the first stripe electrode 41 and the second stripe electrode 42, the parts opposite to each other of the both will form a uniform first electric potential field on the surface of the touch electrode layer 40, in the region between the first stripe electrode 41 and second stripe electrode 42, along a first direction (see FIG. 2, the direction being indicated as $D_1$) and being related to the location.

Here, the "uniform first electric potential field being related to the location" refers to that on the surface of the touch electrode layer 40, located in the region $S_1$ where the first stripe electrode 41 and the second stripe electrode 42 are opposite to each other, among the touch points along the first direction, a touch point nearer to the high potential has a higher potential in the uniform electric potential field formed between the first stripe electrode 41 and the second stripe electrode 42. That is to say, the coordinates of a touch point in the first electric potential field is related to the potential thereof in the uniform electric potential field mentioned above.

Herein, "touch point" refers to the position where the user presses. Herein, "press" refers that the user performs press sufficient to result in a resistance change of the piezoresistive material layer from the top side of the touch electrode layer. Herein, "touch" and "press" are substantially interchangeably used.

Similarly, the third stripe electrode 43 and the fourth stripe electrode 44 are provided oppositely and parallelly, and when a detection circuit applies different voltages to the third stripe electrode 43 and the fourth stripe electrode 44, the parts opposite to each other of the both will form a uniform second electric potential field on the surface of the touch electrode layer 40, in the region between the third stripe electrode 43 and fourth stripe electrode 44, along a second direction (see FIG. 2, the direction being indicated as $D_2$) and being related to the location.

Here, the "uniform second electric potential field being related to the location" refers to that on the surface of the touch electrode layer 40, located in the region $S_2$ where the third stripe electrode 43 and the fourth stripe electrode 44 are opposite to each other, among the touch points along the second direction, a touch point nearer to the high potential has a higher potential in the uniform electric potential field formed between the third stripe electrode 43 and the fourth stripe electrode 44. That is to say, the coordinates of a touch point in the second electric potential field is related to the potential thereof in the uniform electric potential field mentioned above.

On the basis of above, in the above-mentioned OLED touch display panel 01 provided in an example of this disclosure, the piezoresistive material layer 30 covering the cathode 23 is formed by a process, such as coating, on the cathode 23 of the OLED component 20, a full layer of transparent electrode is produced as the touch electrode layer 40 on the piezoresistive material layer 30, and stripe electrodes opposite to each other provided pairwise are formed as detect electrodes on the touch electrode layer 40. Since the touch electrode layer 40 is a full layer formed by coating and is not subjected to patterning treatment, the property of the OLED component 20 would not influenced by the patterning process, so that it is easy to form an incell touch control OLED display panel and the difficulty of the process is lower. When an external force presses in the touch operation zone surrounded by the first stripe electrode 41, the second stripe electrode 42, the third stripe electrode 43 and the fourth stripe electrode 44, the resistance of the underlying piezoresistive material layer 30 corresponding to the press region will change with respect to the other region, so that the connection state between the touch electrode layer 40 corresponding to the press region and the cathode 23 of the OLED component 20 will change. Since the touch point is related to the potential thereof in the uniform first electric potential field formed between the first stripe electrode 41 and the second stripe electrode 42, as well as the potential thereof in the uniform second electric potential field formed between the third stripe electrode 43 and the fourth stripe electrode 44, the touch point can be detected by the respective detection circuit correspondingly.

By taking the detection of the coordinates of the touch point in the first electric potential field along the first direction as an example, the resistance of the piezoresistive material layer 30 decreases specifically when being pressed and thus conduction between the touch electrode layer 40 in the press region and the cathode 23 of the OLED component 20 is built. The detection principle is as follows. For simple and convenience, the first stripe electrode 41 and the second stripe electrode 42 are indicated as L and R, respectively.

After the uniform first electric potential field being related to the location has been formed on the surface of the touch electrode layer 40 along the first direction between the first stripe electrode 41 and the second stripe electrode 42, when touch occurs, the touch point T has the function of dividing the potential of portion of the touch electrode layer 40 between the first stripe electrode 41 and the second stripe electrode 42 along the first direction, and the touch electrode layer 40 is equivalent to two resistances $R_L$ and $R_R$ in series. The resistance of the piezoresistive material layer 30 decreases to a small resistance when being pressed, so that a press current (being indicated as $I_{TOUCH}$ here and below) is generated over the piezoresistive material layer 30. $I_{TOUCH}$ is a function of the resistance ratio of $R_L$ to $R_R$. The specific expression of the function is $I_{TOUCH}=U_R/R_L+U_L/R_R$.

Figure 3:
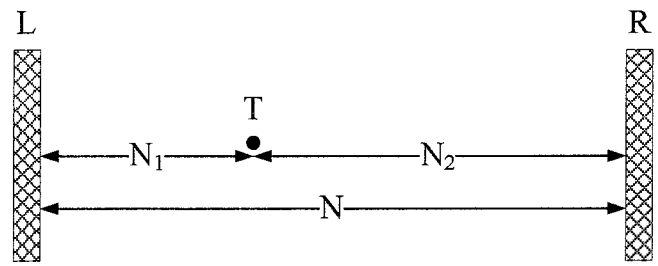
FIG. 3 is a schematic drawing for the principle of detecting the touch point position T provided by an example of this disclosure.

As shown in FIG. 3, if the total length of the region where the first stripe electrode 41 and the second stripe electrode 42 are opposite to each other is assumed as N, and the total resistance of the touch electrode layer 40 is assumed as $R_0$, then the touch point T divides the total length N into two sections $N_1$ and $N_2$. The expression of the function $I_{TOUCH}=U_R/R_L+U_L/R_R$ will further be equal to $$I_{TOUCH} = \frac{U_R}{\frac{N_1}{N} \times R0} + \frac{U_L}{\frac{N_2}{N} \times R0};$$

wherein the $U_R$ and $U_L$ are voltages applied on the two ends, i.e. the first stripe electrode 41 and the second stripe electrode 42 respectively. $U_R$, $U_L$, the total length N and the total resistance $R_0$ are known parameters that may be obtained directly. Thus, the function of the location of the touch point T in the first electric potential field may be obtained from $I_{TOUCH}$. Therefore, $I_{TOUCH}$ may be associated with the coordinates of the touch point T in the first electric potential field.

The principle to determine the coordinates of the touch point T in the second electric potential field along the second direction (accordingly, the direction being Y axis) perpendicular to the third stripe electrode 43 and the fourth stripe electrode 44 is the same as above. The detailed description is not provided repeatedly.

On the basis of above, in order to make the press region as small as possible to increase the touch control precision of the OLED display panel, the above-mentioned OLED touch display panel 01 further comprises (referring to FIG.

1) a separator layer 50 on the touch electrode layer 40. The separator layer 50 comprises a plurality of separators 51 at least distributed in the touch operation zone and filling material 52 that covers the separators 51 and fills the gaps between the separators 51.

For the separator 51, transparent elastic materials, such as resins and silica gels, may be used, for the convenience for press. For the filling material 52, the materials used in thin film encapsulation (TFE) of OLED component in the related art may be used.

When the surface of the OLED touch display panel 01 is pressed by a figure or the like, the separators 51 in the corresponding region will be forced to press the underlying piezoresistive material layer 30, and will further change the resistance of the piezoresistive material layer 30 in this region (i.e. the resistance becoming smaller upon being pressed, or contrarily, becoming larger upon being pressed), so that the connection relationship between the touch electrode layer 40 in the corresponding region and the underlying cathode 23 changes, so as to detect the touch point.

Here, for convenience for the design of the detection circuit, preferably, the piezoresistive material layer 30 mainly consists of a piezoresistive material, whose resistance decreases when pressure is applied thereon.

In other words, in the equivalent electric circuit consisting of the above-mentioned four stripe electrodes, the touch electrode layer 40, the piezoresistive material layer 30 and the cathode 23, before pressing, since the resistance of the piezoresistive material layer 30 is larger when no external force is applied, it is not conductive between the touch electrode layer 40 and the cathode 23; and when being pressed in the touch operation zone, the piezoresistive material layer 30 is pressed and the resistance thereof become smaller, so that conduction between the touch electrode layer 40 in the corresponding region and the cathode 23 is built (electrically connected), and thereby the touch point is detected.

On the basis of above, since only the parts opposite to each other of the two stripe electrodes provided pairwise oppositely can form the uniform electric potential field being related to the location in the opposite region by applying different voltages on the two stripe electrodes respectively, the following configuration of an example of this disclosure is preferred, in order to increase the effective use of the area of the OLED touch display panel mentioned above: both of the lengths of the first stripe electrode 41 and the second stripe electrode 42 are equal to the first length, and the lengths of the parts of the first stripe electrode 41 and the second stripe electrode 42 opposite to each other are equal to the first length; and/or, both of the lengths of the third stripe electrode 43 and the fourth stripe electrode 44 are equal to the second length, and the lengths of the parts of the third stripe electrode 43 and the fourth stripe electrode 44 opposite to each other are equal to the second length.

It should be noticed that the first length and second length mentioned above is only to distinguish the lengths of different stripe electrodes, and the specific values may be the same or different.

On the basis of above, the above-mentioned OLED touch display panel 01 further comprises (referring to FIG. 1) a polarizer sheet 60, an adhesive layer 70 and a protective layer 80 above the touch electrode layer 40 sequentially.

Here, the adhesive layer 70 may be an optically clear adhesive (OCA, specialized adhesive for binding transparent optical elements, such as a lens). For the protective layer 80, transparent flexible material, such as polyethylene terephthalate (PET), polycarbonate (PC), polymethyl methacrylate (PMMA), polyimide (PI), and polyethersulfone resin (PES), may be used, to provide a flexible protective layer that can be deformed under pressure while protecting the structure in the OLED touch display panel.

On the basis of above, an example of this disclosure further provides a display device, which comprises the OLED touch display panel 01 mentioned above and a detection circuit, wherein the detection circuit is configured to detect information of a touch point position on the OLED touch display panel 01 mentioned above.

Here, the display device mentioned above may specifically be products or components having any display function, such as an OLED display, an OLED TV, a mobile phone, a tablet PC, a digital album, an electronic paper, etc.

The detection circuit mentioned above comprises: a voltage supplying terminal for forming alternatively the first electric potential field on the surface of the touch electrode layer 40 along the first direction between the first stripe electrode 41 and the second stripe electrode 42, and the second electric potential field on the surface of the touch electrode layer 40 along the second direction between the third stripe electrode 43 and the fourth stripe electrode 44; the above-mentioned first direction is a direction perpendicular to the length direction of the first stripe electrode 41, and the above-mentioned second direction is a direction perpendicular to the length direction of the third stripe electrode 43;

a process circuit for obtaining alternatively the coordinates of the touch point in the first electric potential field and the second electric potential field according to the difference between the test current (hereafter referred to as $I_{TEST}$), which is the current in the piezoresistive material layer 30 corresponding to the region of the touch point generated by conduction between the touch electrode layer 40 and the cathode 23 of the OLED component 20 upon touch is applied, and the cathode current of the OLED component 20 in the case of without touching (hereafter referred to as $I_{OLED}$) during the period that the OLED touch display panel 01 displays one frame of image.

Here, the test current $I_{TEST}$ in the condition that there is touch equals to the sum of the first electrode current $I_{OLED}$ of the OLED component 20 and the press current at the piezoresistive material layer 30 (hereafter referred to as $I_{TOUCH}$) in the case of without touching. In other words, the difference between the test current $I_{TEST}$ in the condition that there is touch and the cathode electrode current $I_{OLED}$ of the OLED component 20 in the case of without touching equals to the press current $I_{TOUCH}$ at the piezoresistive material layer 30.

The press current at the piezoresistive material layer 30 is the current flows through the piezoresistive material layer, when the piezoresistive material between the touch electrode layer and the first electrode of the OLED component is pressed at the touch point.

In particular, the piezoresistive material layer may comprise a piezoresistive material, whose resistance decreases when pressure is applied thereon. When the piezoresistive material, whose resistance decreases when pressure is applied thereon, is not subjected to any pressure, the piezoresistive material is insulating; and when the piezoresistive material, whose resistance decreases when pressure is applied thereon, is subjected to a pressure exceeding a threshold value, the piezoresistive material at the position where the pressure is applied becomes conductive by being subjected to pressure.

After this type of piezoresistive material is subjected to pressure, when the pressure exceeds the threshold value for this material, the material becomes a resistor with small resistance from an insulator at the position where the pressure is applied. It means that the difference of the magnitudes between this resistance and the resistance of the touch electrode layer may relatively large. For example, the small resistance may be smaller than the resistance of the touch electrode layer by a factor of 50 or more, or 80 or more, or 100 or more. Thus, when the applied pressure has exceed the threshold value and increases further, the resistance becomes smaller further according to the pressure, but is still in this magnitude range. In this case, the equivalent resistance of the piezoresistive material contributes little or nothing to the voltage division, and thus it may be assumed that the further increasing pressure exhibits no substantive influence to $I_{TOUCH}$.

It is apparent that the piezoresistive material may also be a piezoresistive material, whose resistance increases when pressure is applied thereon, so that the pressed zone becomes not conductive, allowing the value of $I_{TOUCH}$ varies contrarily. The location information of the touch point may also be obtained by measuring this contrary variation.

Specifically, the detection circuit mentioned above may be a part of the IC chip driving the OLED touch display panel 01.

For simple and convenience, the first stripe electrode 41 and the second stripe electrode 42 are indicated as L and R below, respectively; and the third stripe electrode 43 and the fourth stripe electrode 44 are indicated as D and U below, respectively.

An example, in which the coordinates of the touch point T in the first electric potential field along the first direction is obtained by the process circuit, is used to explain the general detection principle of the above-mentioned detection circuit briefly below.

Figure 4:
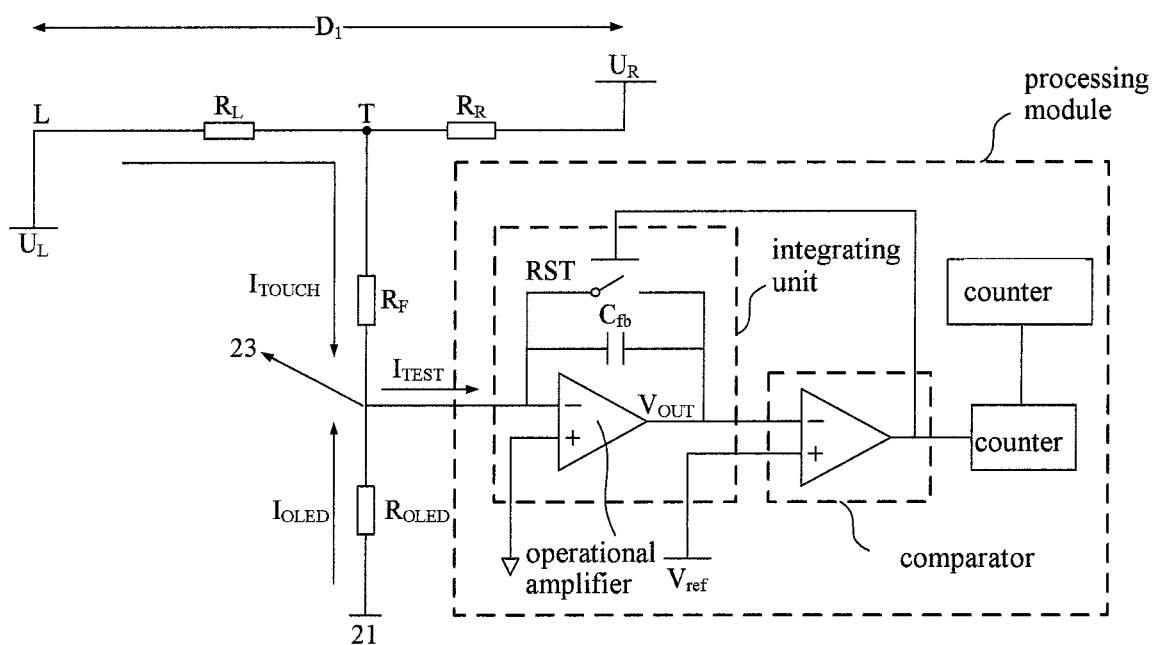
FIG. 4 is a schematic drawing for the principle of a detection circuit provided by an example of this disclosure.

As shown in FIG. 4, a voltage supplying terminal applies a high voltage $U_L$ at the end of the first stripe electrode 41, and applies a low voltage $U_R$ at the opposite end of the second stripe electrode 42, to form a uniform first electric potential field being related to the location along the first direction. Thereafter, when the pressure is applied, the function of the touch point T is equivalent to subjecting the whole touch electrode layer 40 to voltage division along the first direction (for example, the direction being X axis) perpendicular to the first stripe electrode 41 and the second stripe electrode 42, so that the whole touch electrode layer 40 is equivalent to two resistances $R_L$ and $R_R$ in series.

The piezoresistive material layer 30, whose resistance decreases when pressure is applied thereon, is used as an example. When the pressure is applied, the resistance of the piezoresistive material layer 30 becomes smaller, and the current $I_{TOUCH}$ is generated. Since $I_{TOUCH}$ is the function of the resistance ratio of $R_L$ to $R_R$ (the expression thereof: $I_{TOUCH}=U_R/R_L+U_L/R_R$) and this ratio is also a function being related to the location of the touch point T in the first electric potential field, the coordinates of the touch point T in the first electric potential field may be associated with the difference between $I_{TEST}$ and $I_{OLED}$, i.e. $I_{TOUCH}$.

The principle to determine the coordinates of the touch point T in the second electric potential field along the second direction (accordingly, the direction being Y axis) perpendicular to the third stripe electrode 43 and the fourth stripe electrode 44 is the same as above. The detailed description is not provided repeatedly.

Further, a specific structure of a process circuit is provided to describe the above-mentioned process for detecting the location information of the touch point T in details.

Referring to FIG. 4, the process circuit specifically comprises an integrator, a comparator, a counter and a processor.

Here, the integrator comprises an operational amplifier, wherein the operational amplifier has a negative input terminal connected electrically to the cathode 23 of the OLED component 20, and the operational amplifier has a grounded positive input terminal, and the operational amplifier has an output terminal connected electrically to the comparator, to output a voltage output value (indicated as $V_{OUT}$ in the figure and below) to the comparator; a storage capacitance (indicated as $C_{fb}$ in the figure and below), wherein the storage capacitance is connected electrically between the negative input terminal of the operational amplifier and the output terminal of the operational amplifier; a switching circuit (indicated as RST in the figure and below) connected to the storage capacitance $C_{fb}$ in parallel, wherein the switching circuit RST is controlled by an output terminal of the comparator, so as to switch off when the voltage output value $T_{OUT}$ reaches a voltage reference value (indicated as $V_{ref}$ in the figure and below) and switch on when the voltage output value $V_{OUT}$ is smaller than the voltage reference value $V_{ref}$; the negative input terminal of the comparator is electrically connected to the integrator and receives the voltage output value $V_{OUT}$ output by the integrator; a positive input terminal of the comparator receives the voltage reference value $V_{ref}$; the comparator has an output terminal connected electrically to the counter and the integrator; the counter is configured to counting the number of impulse signals output by the output terminal of the comparator; and the processor is configured to obtain alternatively coordinates of the touch point in the first electric potential field or in the second electric potential field according to the time intervals of the counting of the counter.

Here, the integrator is a circuit element carrying out integral operation to the input signals; the comparator is a circuit element outputs different voltage results at the output terminal by comparing the current or voltage values at the positive and negative input terminals; and the counter is a circuit element counting the number of the impulses.

Here, the operational amplifier has the following negative feedback characteristic. When the potential states at the negative input terminal and the output terminal thereof are the same, the potentials at the negative input terminal and the positive input terminal are also equal. That is to say, in an example, in which the positive input terminal of the operational amplifier in FIG. 4 is grounded, when the potential states at the negative input terminal and the output terminal of the operational amplifier are the same, the potential of the negative input terminal and the potential of the will be drawn to the zero potential, because the potential of the positive input terminal is zero.

The example, in which the coordinates of the touch point T in the first electric potential field along the first direction X axis is obtained by the process circuit, is further used below. The particular process for performing the detection of the location of the touch point T by the above-mentioned detection circuit is as follows.

In an initial state, when the OLED touch display panel displays an image but is not subjected to touch, since the piezoresistive material layer 30 is not pressed, the equivalent resistance $R_F$ of the piezoresistive material layer 30 exhibits a high resistance. In the above-mentioned detection circuit, it may be assumed that there is no current flowing through the piezoresistive material layer 30. That is to say, $I_{TOUCH}=0$. In this case, $I_{TEST}$ consists of the current in the cathode of the OLED component only, i.e. $I_{TFST}=I_{OLED}$.

Since all the cathodes of the OLED component are at a constant potential during the period of displaying one frame of image, i.e. all $I_{OLED}$ being the same, $I_{OLED}$ is a known item during the period of displaying each frame of image. After the current $I_{OLED}$ enters the integrator, since the switching circuit RST in the integrator is in the "on" state in the initial state, $C_{fb}$ is in a state to be charged. $C_{fb}$ is charged by $I_{OLED}$. The negative input terminal of the comparator is used to receive $V_{OUT}$ output from the integrator. After a time of $t_0$, $T_{OUT}$ reaches a predetermined $V_{ref}$ applied to the positive input terminal of the comparator (i.e. $V_{OUT}=V_{ref}$). The expression of $t_0$ therein is $$t_0 = C_{fb} \times V_{ref}/I_{TEST} = C_{fb} \times V_{ref}/I_{OLED}.$$

The output terminal of the comparator outputs an impulse signal to the switching circuit RST, to allow the switching circuit RST switching off, so that $C_{fb}$ discharges, or in other words, $C_{fb}$ is reset. After the switching circuit RST is switched off, in the integrator, the potential states of the negative input terminal of the operational amplifier and the output terminal of the operational amplifier are the same. Since the negative feedback characteristic possessed by the operational amplifier, the potential of the negative input terminal thereof will be drawn to the zero potential of the positive input terminal. That is to say, the output terminal potential is also zero. $V_{out}$ output by the output terminal of the operational amplifier is zero. In other words, after the switching circuit RST is switched off, $V_{out}<V_{ref}$, and the impulse signal output from the output terminal of the comparator to the switching circuit RST is back to zero. Therefore, the switching circuit RST is switched on again. Thus, the counter counts the number of the impulse signals output from the output terminal of the comparator. Since the time interval of counting the impulse signal is $t_0$, an initial frequency of $f_0=1/t_0$ may be obtained. The frequency of $f_0$ is set to be smaller than the refresh frequency of one frame of image of the OLED touch display panel 01 mentioned above. That is to say, during the period that the OLED touch display panel 01 displays one frame of image, the charge-discharge process of $C_{fb}$ mentioned above is repeated in the detection circuit. Thereby an initial frequency $f_0$ of the OLED touch display panel 01 in the case of without touching point may be obtained.

When the OLED touch display panel 01 mentioned above is subjected to touch, the piezoresistive material layer 30 is pressed, and the equivalent resistance $R_F$ thereof exhibits a low resistance. $I_{TOUCH}$ is generated. As can be known from the description above, $I_{TOUCH}$ is the function of the resistance ratio of $R_L$ to $R_R$ and this ratio is also a function being related to the location of the touch point T in the first electric potential field along the first direction, the coordinates of the touch point T in the first electric potential field may be associated with $I_{TOUCH}$. Since $I_{TOUCH}$ is not zero in the case of with touching, $I_{TEST}$ consists of the current in the cathode of the OLED component and the press current $I_{TOUCH}$ flowing through the piezoresistive material layer 30, i.e. $I_{TEST}=I_{TOUCH}+I_{OLED}$. Since $I_{TEST}$ increases as compared to the case of no touch, the $T_{OUT}$ output by the integrator received by the negative input terminal of the comparator will reach the predetermined $V_{ref}$ applied to the positive input terminal of the comparator by a time $t_1$ less than $t_0$, wherein the expression of $t_1$ is $$t_1 = C_{fb} \times V_{ref}/I_{TEST} = C_{fb} \times V_{ref}/(I_{TOUCH}+I_{OLED}).$$

Obviously, $t_1<t_0$. The number of the impulse signals output by the output terminal of the comparator, which is counted by the counter, is larger. The time interval of counting the impulse signals in the case of with touching is $t_1$. Thereby, a frequency of $f_1=1/t_1$ in the case of with touching is obtained. Obviously, $f_1 > f_0$. That is to say, in the case of with touching, the frequency of the counting of the counter becomes larger. For example, when $U_L > U_R$, in the first electric potential field along the first direction X axis formed by the parts of the first stripe electrode 41 and the second stripe electrode 42 opposite to each other, the potential of the touch point T closer to the L end is larger. Therefore, $I_{TOUCH}$ is larger. Thus, in term of the frequency of the counting of the counter, $f_1$ is larger. The coordinates of the touch point T can be determined by the processor connected to the counter.

The principle to alternative determine the coordinates of the touch point T in the second electric potential field along the second direction (accordingly, the direction being Y axis) perpendicular to the third stripe electrode 43 and the fourth stripe electrode 44 by the process circuit is the same as above. The detailed description is not provided repeatedly.

On the basis of above, an example of this disclosure further provides a driving method of the above-mentioned display device. The method comprises the following steps.

Step S1: forming alternatively the first electric potential field on the surface of the touch electrode layer 40 along the first direction between the first stripe electrode 41 and the second stripe electrode 42, and the second electric potential field on the surface of the touch electrode layer 40 along the second direction between the third stripe electrode 43 and the fourth stripe electrode 44; the above-mentioned first direction is a direction perpendicular to the length direction of the first stripe electrode 41, and the second direction is a direction perpendicular to the length direction of the third stripe electrode 43;

Step S2: obtaining alternatively the coordinates of the touch point in the first electric potential field and the second electric potential field according to the difference (i.e. $I_{TOUCH}$) between the test current $I_{TEST}$, which is the current in the piezoresistive material layer 30 corresponding to the region of the touch point generated by conduction between the touch electrode layer 40 and the cathode 23 of the OLED component 20 upon touch is applied, and the cathode current $I_{OLED}$ of the OLED component 20 in the case of without touching, during the period that the OLED touch display panel 01 displays one frame of image.

On the basis of above, step S2 may further comprises the following sub-steps:

Step S21: obtaining the first time interval $t_0$ of the counting of the counter according to the cathode current $I_{OLED}$ of the OLED component 20 in the case of without touching, during the period that the OLED touch display panel 01 displays one frame of image;

Step S22: obtaining the second time interval $t_1$ of the counting of the counter according to the test current $I_{TEST}$ in the piezoresistive material layer 30 corresponding to the region of the touch point generated after the conduction between the touch electrode layer 40 in the press region and the cathode 23 of the OLED component 20 is built in the case of with touching, during the period that the OLED touch display panel 01 displays one frame of image;

Step S23: alternatively obtaining the coordinates of the touch point in the first electric potential field and the second electric potential field according to the difference between the reciprocal of the second time interval $t_1$ (i.e. frequency $f_1$) and the reciprocal of the first time interval $t_0$ (i.e. frequency $f_0$).

Here, as can be known from the above-mentioned configuration of the detection circuit, the difference between the reciprocal $f_1$ of the second time interval $t_1$ and the reciprocal of the first time interval $t_0$ (i.e. frequency $f_0$) satisfies the following function expression:

$$f_1 - f_0 = \frac{(I_{TEST} - I_{OLED})}{C_{fb} \times V_{ref}} = \frac{I_{TOUCH}}{C_{fb} \times V_{ref}}.$$

That is to say, the difference between $f_1$ and $f_0$ is a linear function of $I_{TOUCH}$. The potential of the touch point T closer to the high potential is larger. Therefore, $I_{TOUCH}$ is larger. Thus, in term of the frequency of the counting of the counter, $f_1$ is larger. The coordinates of the touch point T can be determined by the processor connected to the counter.

A person skilled in the art can understand that the all or some steps for performing the above-mentioned driving method may be carried out by a hardware associated with program instructions. The above-mentioned program can be stored in a computer-readable storage medium. When the program is performed, the steps including the example of the method mentioned above are carried out. The above-mentioned storage medium comprises various media capable of storing program codes, such as ROM, RAM, a disk, a CD, or the like.

The above mentioned embodiments are only specific embodiments of this disclosure. The protection scope of this disclosure is not limited thereto. Any changes or modifications that may be envisaged by a person skilled in the art easily in the technical range disclosed by this disclosure are involved in the protection scope of this disclosure. Therefore, the protection scope of this disclosure is the protection scope of the claims.

The invention claimed is:

1. A display device, comprising an OLED touch display panel and a detection circuit,
   wherein the OLED touch display panel comprises:
   an OLED component, which comprises a first electrode;
   a piezoresistive material layer, which is above the first electrode of the OLED component;
   a touch electrode layer, which is above the piezoresistive material layer; and
   a first stripe electrode, a second stripe electrode, a third stripe electrode and a fourth stripe electrode, which are above the touch electrode layer and not contacted with each other;
   wherein the first stripe electrode and the second stripe electrode are provided oppositely and parallelly, and configured to form a first electric potential field on the touch electrode layer between the first stripe electrode and the second stripe electrode along a first direction perpendicular to a length direction of the first stripe electrode; the third stripe electrode and the fourth stripe electrode are provided oppositely and parallelly, and configured to form a second electric potential field on the touch electrode layer between the third stripe electrode and the fourth stripe electrode along a second direction perpendicular to a length direction of the third stripe electrode; the length direction of the first stripe electrode is perpendicular to the length direction of the third stripe electrode; the first stripe electrode, the second stripe electrode, the third stripe electrode and the fourth stripe electrode define a touch operation zone, wherein the detection circuit is configured to detect information of a touch point position on the OLED touch display panel, and the detection circuit comprises:
  a voltage source, which is connected to the first to the fourth stripe electrodes, respectively, to form the first electric potential field and the second electric potential field alternately; and
  a process circuit, which is configured to obtain alternatively coordinates of the touch point in the first electric potential field and the second electric potential field according to a press current at the touch point during the period that the OLED touch display panel displays one frame of image, wherein the press current is a current which flows through the piezoresistive material layer when the piezoresistive material between the touch electrode layer and the first electrode of the OLED component at the touch point is subjected to pressure.

2. The display device according to claim 1, wherein
the piezoresistive material layer comprises a piezoresistive material, whose resistance decreases when pressure is applied thereon, and when the piezoresistive material, whose resistance decreases when pressure is applied thereon, is not subjected to any pressure, the piezoresistive material is insulating; and when the piezoresistive material, whose resistance decreases when pressure is applied thereon, is subjected to a pressure exceeding a threshold value, the piezoresistive material becomes conductive at the position where the pressure is applied, and
the press current is a current which flows through the piezoresistive material layer when the piezoresistive material between the touch electrode layer and the first electrode of the OLED component at the touch point becomes conductive by being subjected to pressure.

3. The display device according to claim 2, wherein the process circuit comprises an integrator, a comparator, a counter and a processor, wherein the integrator comprises
  an operational amplifier, wherein the operational amplifier has a negative input terminal connected electrically to the first electrode of the OLED component, and the operational amplifier has a grounded positive input terminal, and the operational amplifier has an output terminal connected electrically to a negative input terminal of the comparator, to output a voltage output value to the comparator;
  a storage capacitance, wherein the storage capacitance is connected electrically between the negative input terminal of the operational amplifier and the output terminal of the operational amplifier;
  a switching circuit connected to the storage capacitance in parallel, wherein the switching circuit is controlled by an output terminal of the comparator, so as to switch off when the voltage output value reaches a voltage reference value and switch on when the voltage output value is smaller than the voltage reference value;

the negative input terminal of the comparator receives the voltage output value output by the operational amplifier; a positive input terminal of the comparator receives the voltage reference value; the comparator has an output terminal connected electrically to the counter, and the output terminal is also configured to control the switching circuit;

the counter is configured to counting the number of impulse signals output by the output terminal of the comparator; and the processor is configured to obtain alternatively coordinates of the touch point in the first electric potential field or in the second electric potential field according to the time intervals of the counting of the counter.

* * * * *